United States Patent [19]
Chou et al.

[11] Patent Number: 5,710,524
[45] Date of Patent: Jan. 20, 1998

[54] CLOCK SYNTHESIZER FOR LOW EMI APPLICATIONS

[75] Inventors: Chun-Ming Chou; Jia-Der Hsieh; Tsen-Shau Yang, all of Hsin-Chu, Taiwan

[73] Assignee: Myson Technology, Inc., Taiwan

[21] Appl. No.: 629,513

[22] Filed: Apr. 9, 1996

[51] Int. Cl.$^6$ ........................................... H03L 7/18
[52] U.S. Cl. .................. 331/1 A; 327/159; 327/160; 327/107; 375/376; 377/47; 395/555
[58] Field of Search ............................. 331/1 A, 105, 331/25; 395/555, 556; 327/107, 159, 160; 375/375, 376; 377/47, 49, 52

[56] References Cited

U.S. PATENT DOCUMENTS 5,610,955  3/1997  Bland .......................... 375/376

*Primary Examiner*—Robert Pascal
*Assistant Examiner*—Arnold Kinkead
*Attorney, Agent, or Firm*—Cushman Darby & Cushman IP Group of Pillsbury Madison & Sutro LLP

[57] ABSTRACT

The object of the present invention is to provide a clock synthesizer IC which can produce clock signals with much lower radiated EMI. The clock synthesizer IC comprises: a forward programmable counter for dividing the frequency of input clock signals by M; a feedback programmable counter for dividing the frequency of input clock signals by N; a phase-frequency detector for accepting one input signal from said forward programmable counter and another from said feedback programmable counter, outputting two signals whose levels are determined by phase difference of said two input signals; a loop filter accepting the output signal of said phase-frequency detector and outputting a signal with high-frequency component filtered out; a voltage-controlled oscillator accepting the output signal of said loop filter and outputting a signal as the input signal of said feedback programmable counter and as the output signal of the whole clock synthesizer whose frequency is determined by input voltage; a programmable logic array, for controlling the dividing-number M and N of said forward programmable counter and said feedback programmable counter respectively. An up/down counter for controlling the dividing-number N of said feedback programmable counter in cooperation with said programmable logic array by way of dividing the binary representation of said dividing-number $D_n D_{(n-1)} \ldots D_1 D_0$ into two groups: $D_n \ldots D_k$ and $D_{(k-1)} \ldots D_0$ and controlling them by said programmable logic array and said up/down counter respectively in which the time interval of transition of $D_n D_{(n-1)} \ldots D_1 D_0$ is determined by said up/down counter.

2 Claims, 6 Drawing Sheets

FIG. 3A
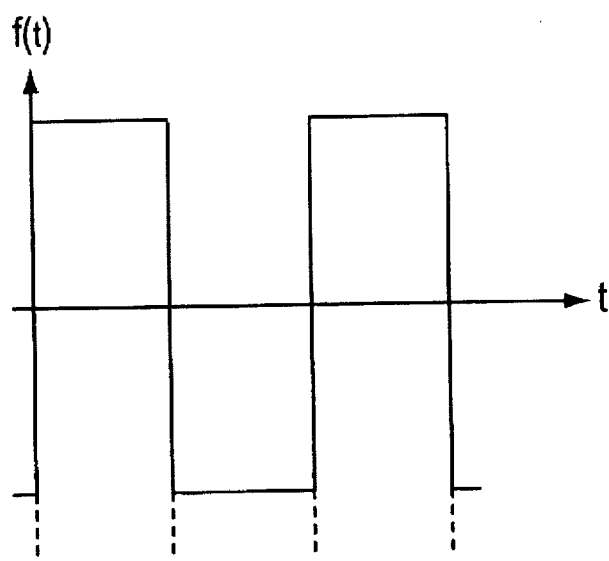
↓ DECOMPOSITION
FIG. 3B
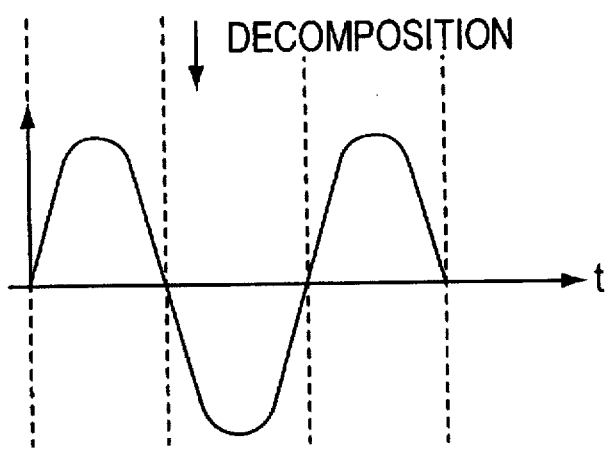
FIG. 3C
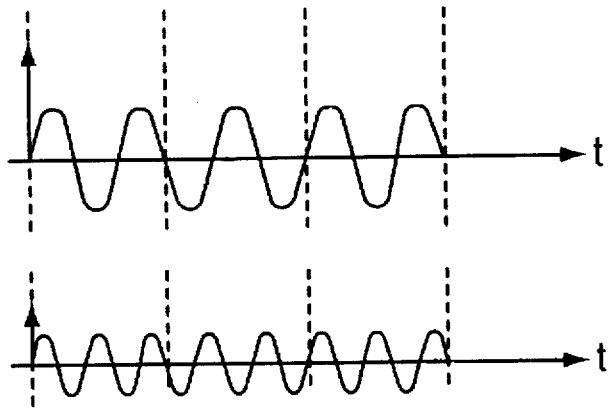
FIG. 3D

CLOCK SYNTHESIZER FOR LOW EMI APPLICATIONS

BACKGROUND OF THE INVENTION

1. Field of the Invention

The present invention relates in general to a clock synthesizer integrated circuit (IC), and specifically to a clock synthesizer IC for CPU and bus clock in personal computer applications. Considering the bad influence coming from Electro-Magnetic-Interference (EMI), the present invention provides a unique circuit and approach to produce clock signals with much lower radiated EMI.

2. Technical Background

In conventional clock synthesizer IC, clock signals are produced by a Digital Phase Locked Loop (DPLL). FIG. 1 shows a block diagram of conventional DPLL comprising: divide-by-M counter 1 which outputs a clock signal with frequency that of input clock signal divided by M, phase-frequency detector 2 which accepts two input signals and outputs two signals whose levels are determined by phase difference of the two input signals, loop filter 3 which filters out high-frequency signals, voltage-controlled oscillator 4 which outputs a signal whose frequency is determined by input voltage, and divide-by-N counter 5 which outputs a clock signal with frequency that of input clock signal divided by N.

While the above DPLL is locked, the two signals entering phase-frequency detector 2 have identical frequency. Assume the output signals of divide-by-N counter 5 and divide-by-M counter 1 are represented by $f_a$ and $f_b$ respectively, then $$f_a = f_b \tag{1}$$

Assume the frequency of input signal of divide-by-M counter 1, i.e. input signal of the whole DPLL, is represented by $f_{ref}$, and the frequency of output signal of voltage-controlled oscillator 4, i.e. output signal of the whole DPLL, is represented by $f_{osc}$, then $$f_{osc} = f_{ref} * (N/M) \tag{2}$$

Therefore, a clock signal with predetermined frequency can be derived by adequately choosing the values of M and N.

Concerning the aforementioned divide-by-M counter 1 and divide-by-N counter 5, their dividing number can be fixed (M,N: fixed) or adjustable (M,N: not fixed), wherein clock signals with a couple of different frequencies can be derived for the case of adjustable dividing number. Specifically, suppose that two different frequencies $f_{osc1}$ and $f_{osc2}$ are to be derived given input frequency $f_{ref}$, this can be achieved by finding out two integer pairs (M1,N2) and (M2,N2) such that $$f_{osc1} = f_{ref} * (N1/M1) \tag{3}$$

$$f_{osc2} = f_{ref} * (N2/M2) \tag{4}$$

FIG. 2 gives a practical embodiment which can produce clock signals with three different frequencies 50/60/66.6 MHz comprising: divide-by-2 counter 1, phase-frequency detector 2, loop filter 3, voltage-controlled oscillator 4, divide-by-4 counter 5, 6-bit programmable counter 6 (divide-by-23, 22, and 19), 6-bit programmable counter 7 (divide-by-40, 46 and 44), and programmable logic array 8, wherein the same reference numbers as in FIG. 1 refer to identical components. Programmable counters 6 and 7 are provided with three different dividing numbers (23, 22, 19 and 40, 46, 44) respectively, which are controlled by programmable logic array 8. Programmable logic array 8 has two input ends SEL0 and SEL1 which corresponds with four different binary representations: (1) SEL0=0 & SEL1=0; (2) SEL0=0 & SEL1=1; (3) SEL0=1 & SEL1=0; (4) SEL0=1 & SEL1=1. Among these, the combination "SEL0=1 & SEL1=1" is prohibited. Each of the other three combinations corresponds with one pair of dividing numbers of programmable counters 6 and 7 as follows.

(1) SEL0=0 & SEL1=0, the dividing numbers are 23 and 40 respectively;

(2) SEL0=0 & SEL1=1, the dividing numbers are 22 and 46 respectively;

(3) SEL0=1 & SEL1=0, the dividing numbers are 19 and 44 respectively.

In the circuit illustrated by FIG. 2, the frequency-dividing in both forward and feedback directions are accomplished via two stages. For example, clock signals from voltage-controlled oscillator 4 are divided (their frequencies) by 4 due to divide-by-4 counter 5, then divided by 40 (controlled by programmable logic array 8) due to programmable counter 7. The resulting dividing number in feedback direction is thus 160. The reason why dividing is accomplished via two stages is to avoid a considerable dividing-number in a single stage which leads to considerable bit number in that stage, for example, a 8-bit counter is necessary to provide a dividing-number 160. The input clock signals of divide-by-2 counter 1 has frequency $f_{ref}$=14.31818 MHz, clock signals with the following three different frequencies $f_{osc}$ can be derived according to equation (2):

$$14.31818 \text{ MHz} * (160/46) = 49.802 \text{ MHz} \tag{5}$$

$$14.31818 \text{ MHz} * (184/44) = 59.876 \text{ MHz} \tag{6}$$

$$14.31818 \text{ MHz} * (176/38) = 66.316 \text{ MHz} \tag{7}$$

Though the DPLL of FIG. 2 can produce desirable clock signals, the issue of EMI is not taken into consideration. Clock signals are periodic rectangular waves which can be decomposed into superposition of infinite sinusoidal waves according to Fourier transform. As shown in FIG. 3, wherein the periodic rectangular wave represents original clock signal which can be decomposed into superposition of all the sinusoidal waves. Among these sinusoidal waves, the one which has minimum frequency is fundamental component, the minimum frequency is called fundamental frequency. Other sinusoidal waves have frequencies which are multiples of said fundamental frequency. EMI, which is harmful to human being, occurs at the frequencies of all the sinusoidal waves, especially at the fundamental frequency.

SUMMARY OF THE INVENTION

It is therefore the primary object of the present invention to provide a clock synthesizer IC which can produce clock signals with much lower radiated EMI.

It is another object of the present invention to provide a clock synthesizer IC whose characteristics can be changed by making simple modifications to original circuit if necessary.

In order to reduce EMI associated with clock signals, the clock synthesizer IC in accordance with the present invention is based on the following principle. Assume that clock signals with frequency f is to be produced for a specific utilization, then clock signals with frequencies between $f-\Delta f$ and f+Δf can be used instead if Δf/f is small enough. For example, frequency variation (Δf/f) less than 2% is allowable for the case of clock signals used in CPU or bus. Therefore, suppose that clock signals with frequency f are desirable, then clock signals with frequencies between 0.98f and 1.02f can be used instead. Its associated EMI is thus changed from concentrating at frequency f to distributing over the range between 0.98f and 1.02f, which greatly reduces EMI level.

The aforementioned principle is achieved by utilizing a unique circuit design of DPLL, by which many characteristics such as frequency variation (Δf/f) and the EMI level, can be adjusted by making simple modifications to original circuit. Since the synthesized clock signals have frequencies between f−Δf and f+Δf, its associated EMI does not concentrate at frequency f, but distributes over the frequency range between f−Δf and f+Δf. In practice, the synthesized clock signals have frequencies not only distributing over the above frequency range, but also varying very slowly with time.

Referring to equation (2), the desirable clock signals as described can be synthesized by loading continuous integer pair (M,N) into the divide-by-M counter 1 and the divide-by-N counter 5. It is obvious that the synthesized clock signals have multiple frequencies, besides the multiple frequencies can be controlled to lie in a very narrow band, i.e. the synthesized clock signals have very small phase jitter, by choosing the values of (M,N) adequately. Furthermore, it is crucial that frequencies of synthesized clock signals vary slowly with time considering the feasibility of circuit design.

BRIEF DESCRIPTION OF THE DRAWINGS

The detailed structure, features and characteristics of the present invention will be described more clearly with the descriptions of the preferred embodiments in conjunction with the accompanying drawings, in which:

FIG. 3 illustrates that a periodic rectangular wave can be decomposed into infinite sinusoidal wave components;

DETAILED DESCRIPTION OF THE PREFERRED EMBODIMENT

To design a clock synthesizer IC which produces clock signals with low EMI, feasibility of the clock synthesizer IC is a crucial issue. In other words, an ideal clock signal should satisfy the following three conditions simultaneously.

(1) Frequency variation (Δf/f) is very small;

(2) Phase jitter is very small;

(3) Stability is high.

Figure 4:
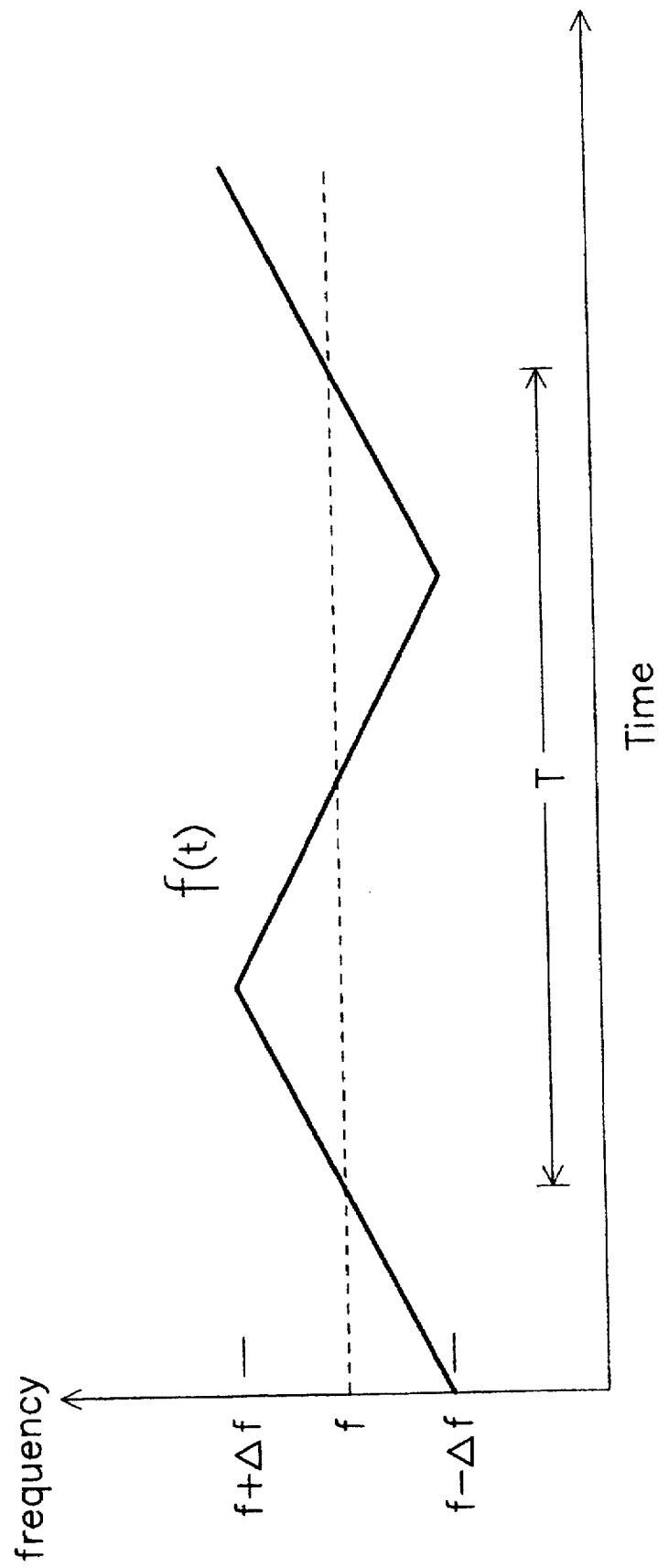
FIG. 4 shows the variation of frequency with respect to time of ideal clock signals with low EMI.

As analyzed in the above, while clock signals with specific frequency f is desired, clock signals having frequencies between f−Δf and f+Δf (Δf/f: very small) can be used instead such that the radiated EMI is much lower. Besides, the frequencies should vary with time slowly considering the stability of clock synthesizer IC, a preferred embodiment is that frequencies vary with time slowly and periodically, as illustrated in FIG. 4. Assume the variation of frequency with respect to time has period T, then $$\Delta f \quad 0.02f \tag{8}$$

$$T \gg 1/f \tag{9}$$

Figure 5:
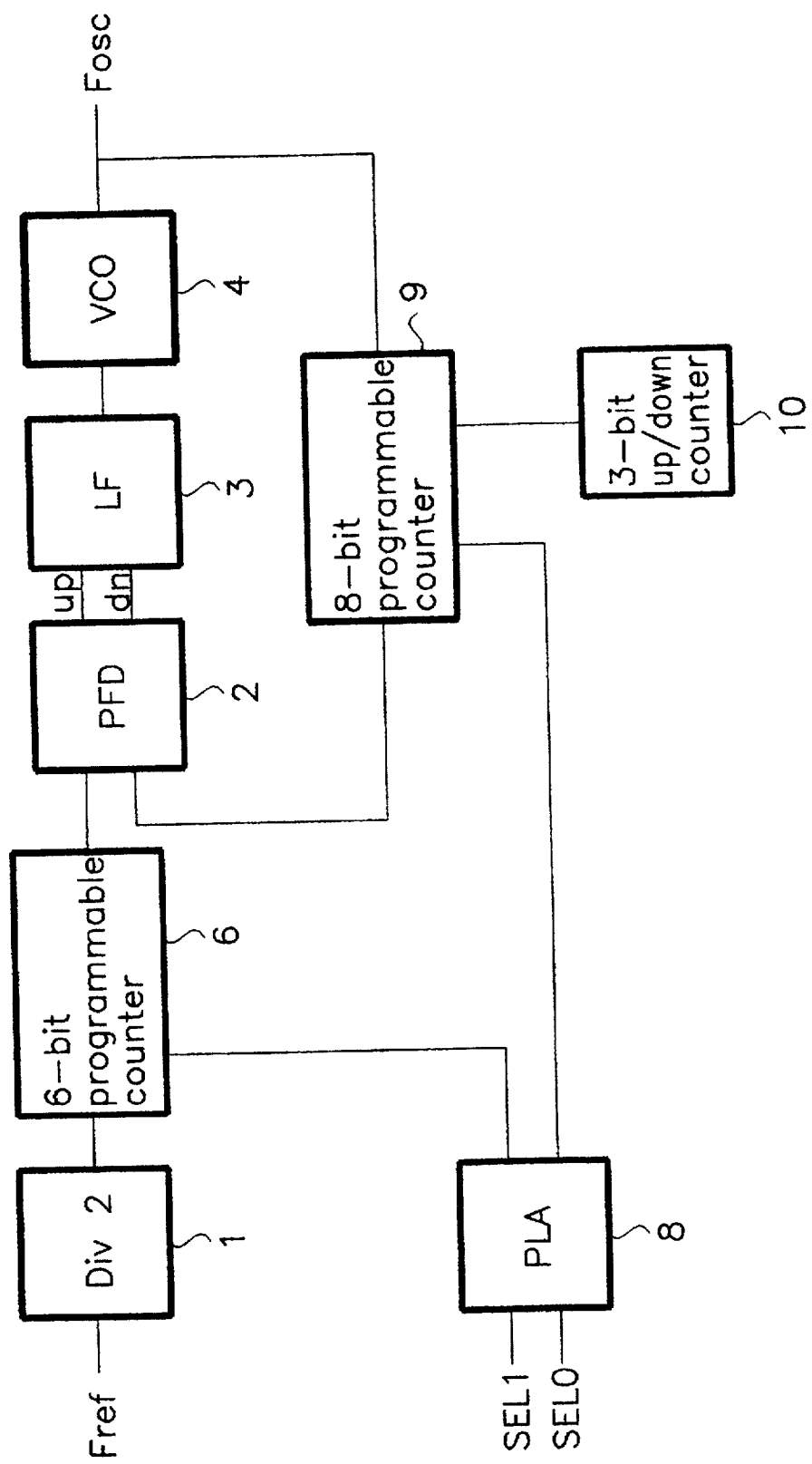
FIG. 5 is a block diagram of the clock synthesizer IC in accordance with the present invention.

To prevent external perturbation from pulling the DPLL out of lock, a preferred embodiment is shown in the block diagram of FIG. 5, wherein divide-by-2 counter 1, phase-frequency detector 2, loop filter 3, voltage-controlled oscillator 4, 6-bit programmable counter 6 (divide-by-23, 22, and 19), programmable logic array 8, 8-bit programmable counter 9, and 3-bit up/down counter 10 are included.

The 8-bit programmable counter 9 is incorporated to increase the resolution of the synthesized frequency. Specifically, 8-bit, $D_7D_6D_5D_4$ $D_3D_2D_1D_0$, are divided into high group $D_7D_6D_5D_4D_3$ and low group $D_2D_1D_0$. High group $D_7D_6D_5D_4D_3$ has three options 10011, 10110, and 10101, wherein which one is used is controlled by programmable logic array 8, similar to FIG. 2. Low group $D_2D_1D_0$ corresponds with eight binary representations: 000~111, which is controlled by 3-bit up/down counter 10.

Programmable logic array 8 controls high group $D_7D_6D_5D_4D_3$ and 6-bit programmable counter 6 simultaneously. While 6-bit programmable counter 6 has dividing-number 23, $D_7D_6D_5D_4D_3$ is 10011 and $D_7D_6D_5D_4D_3D_2D_1D_0$ thus corresponds with eight binary representations. Please note that dividing-number N is generally stored in programmable counter in the form of binary representation of (N−2). The following table lists the eight binary representations of $D_7D_6D_5D_4D_3D_2D_1D_0$, their corresponding decimal number, and dividing-number.

| No. | $D_7D_6D_5D_4D_3D_2D_1D_0$ | decimal number | dividing-number |
|---|---|---|---|
| 1. | 10011000 | 152 | 154 |
| 2. | 10011001 | 153 | 155 |
| 3. | 10011010 | 154 | 156 |
| 4. | 10011011 | 155 | 157 |
| 5. | 10011100 | 156 | 158 |
| 6. | 10011101 | 157 | 159 |
| 7. | 10011110 | 158 | 160 |
| 8. | 10011111 | 159 | 161 |

Therefore, assume that input clock signals of FIG. 5 have frequency $f_{ref}$=14.31818 MHz, then the output clock signals have frequency $f_{osc}$ as follows.

| No. | $D_7D_6D_5D_4D_3D_2D_1D_0$ | fosc(MHz) |
|---|---|---|
| 1. | 10011000 | 14.31818 * (154/46) = 47.935 |
| 2. | 10011001 | 14.31818 * (155/46) = 48.246 |
| 3. | 10011010 | 14.31818 * (156/46) = 48.558 |
| 4. | 10011011 | 14.31818 * (157/46) = 48.869 |
| 5. | 10011100 | 14.31818 * (158/46) = 49.180 |
| 6. | 10011101 | 14.31818 * (159/46) = 49.491 |
| 7. | 10011110 | 14.31818 * (160/46) = 49.802 |
| 8. | 10011111 | 14.31818 * (161/46) = 50.113 |

While 6-bit programmable counter 6 has dividing-number 22 and respectively, $D_7D_6D_5D_4D_3$ is 10110 and 10101 respectively. Similarly, $D_7D_6D_5D_4D_3D_2D_1D_0$ correponds with eight binary representations, corresponding with the eight binary representations (000~111) of $D_2D_1D_0$, under each above situation. Likewise, given input clock signals with frequency $f_{ref}$=14.31818 MHz, then the output clock signals with frequency $f_{osc}$ are listed as follows.

While $D_7D_6D_5D_4D_3$ is 10110:

| No. | $D_7D_6D_5D_4D_3D_2D_1D_0$ | fosc(MHz) |
|---|---|---|
| 1. | 10110000 | 14.31818 * (178/44) = 57.924 |
| 2. | 10110001 | 14.31818 * (179/44) = 58.249 |
| 3. | 10110010 | 14.31818 * (180/44) = 58.574 |
| 4. | 10110011 | 14.31818 * (181/44) = 58.899 |
| 5. | 10110100 | 14.31818 * (182/44) = 59.224 |
| 6. | 10110101 | 14.31818 * (183/44) = 59.549 |
| 7. | 10110110 | 14.31818 * (184/44) = 59.876 |
| 8. | 10110111 | 14.31818 * (185/44) = 60.201 |

While $D_7D_6D_5D_4D_3$ is 10101:

| No. | $D_7D_6D_5D_4D_3D_2D_1D_0$ | fosc(MHz) |
|---|---|---|
| 1. | 10101000 | 14.31818 * (170/38) = 64.055 |
| 2. | 10101001 | 14.31818 * (171/38) = 64.432 |
| 3. | 10101010 | 14.31818 * (172/38) = 64.808 |
| 4. | 10101011 | 14.31818 * (173/38) = 65.185 |
| 5. | 10101100 | 14.31818 * (174/38) = 65.562 |
| 6. | 10101101 | 14.31818 * (175/38) = 65.939 |
| 7. | 10101110 | 14.31818 * (176/38) = 66.316 |
| 8. | 10101111 | 14.31818 * (177/38) = 66.693 |

Figure 1:
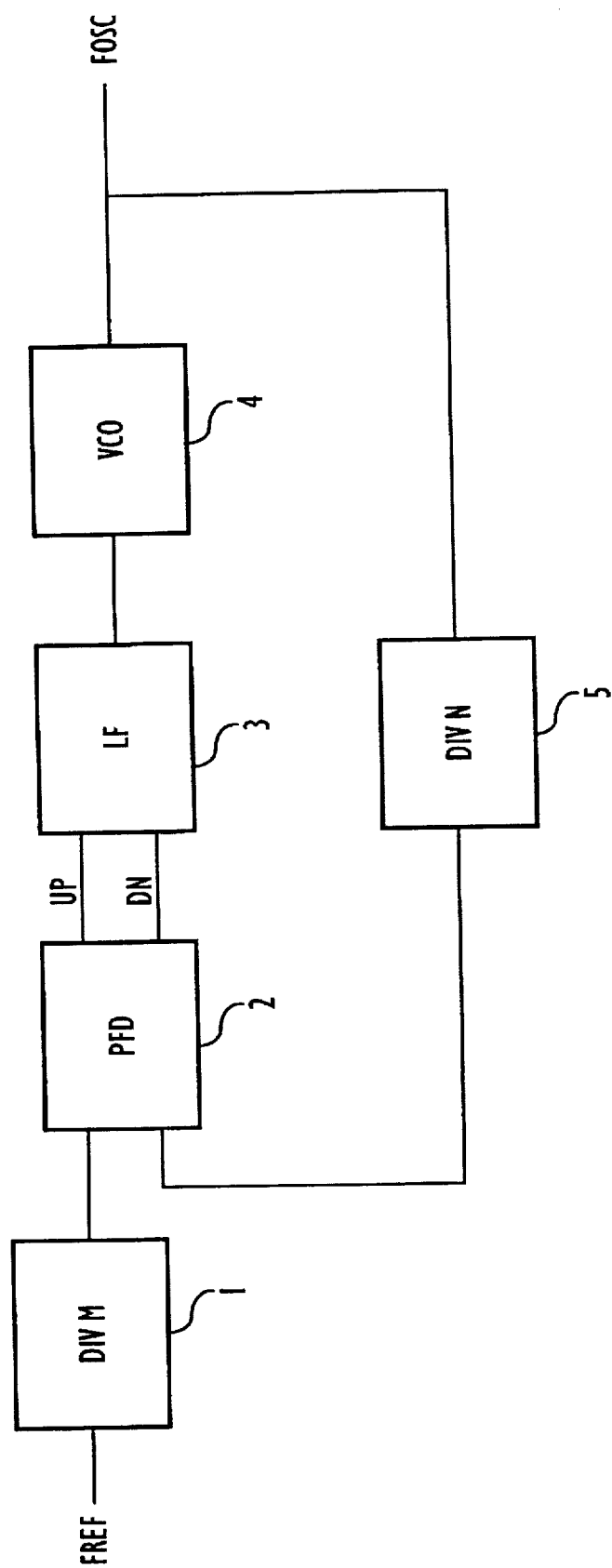
FIG. 1 is a block diagram of conventional clock synthesizer IC.
Figure 2:
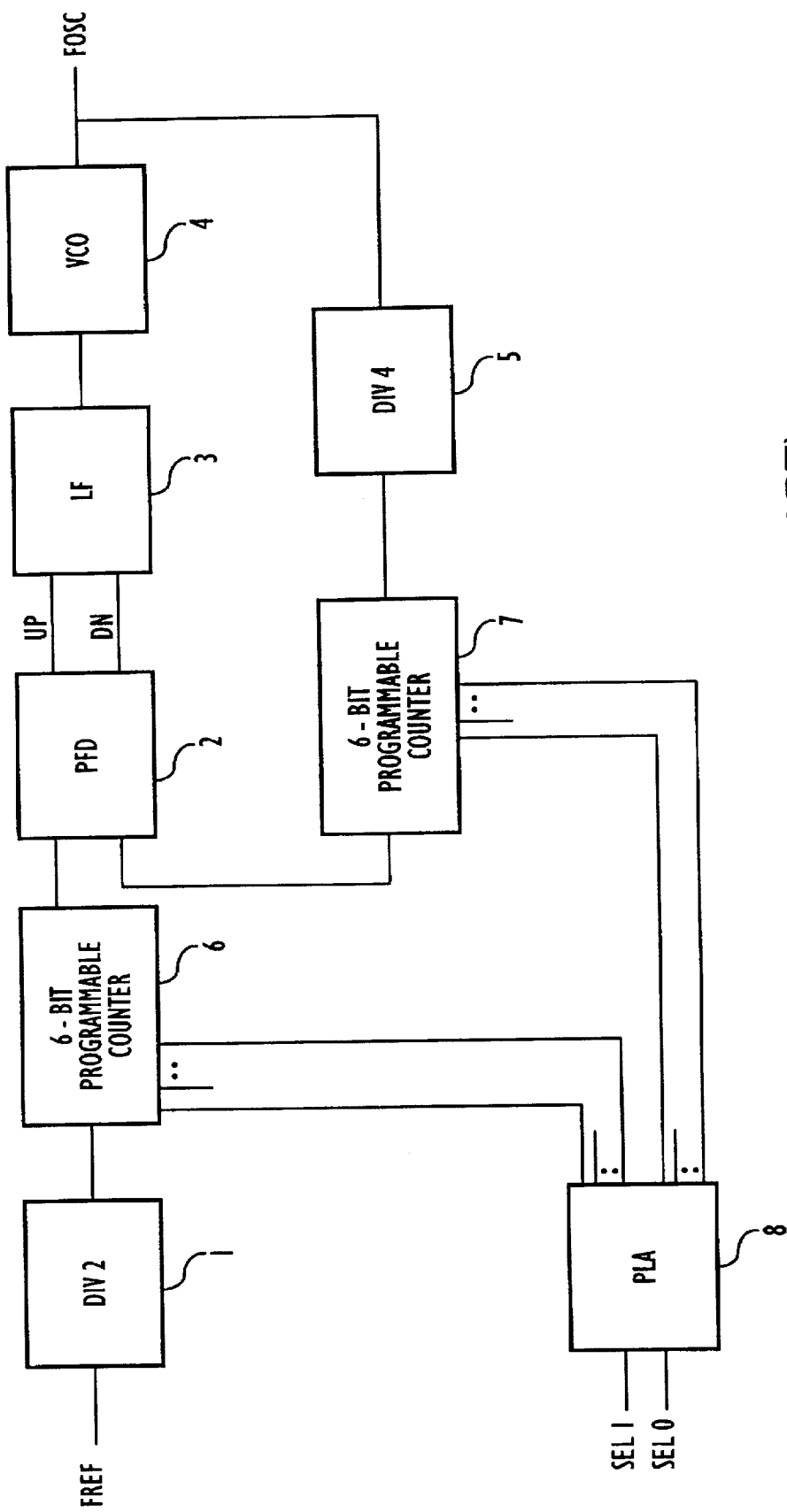
FIG. 2 is an embodiment of conventional clock synthesizer IC for producing 50/60/66.6 MHz clock signals.

In other words, corresponding to each of the output clock signals frequencies (Referring to equations (5), (6) and (7)) derived by the conventional clock synthesizer IC shown in FIG. 2, eight different frequencies can be derived using the clock synthesizer IC of the present invention shown in FIG. 5. For the eight frequencies, the differences between each adjacent frequency pair are very small and each frequency is very near to the corresponding frequency derived by conventional clock synthesizer IC.

Figure 6:
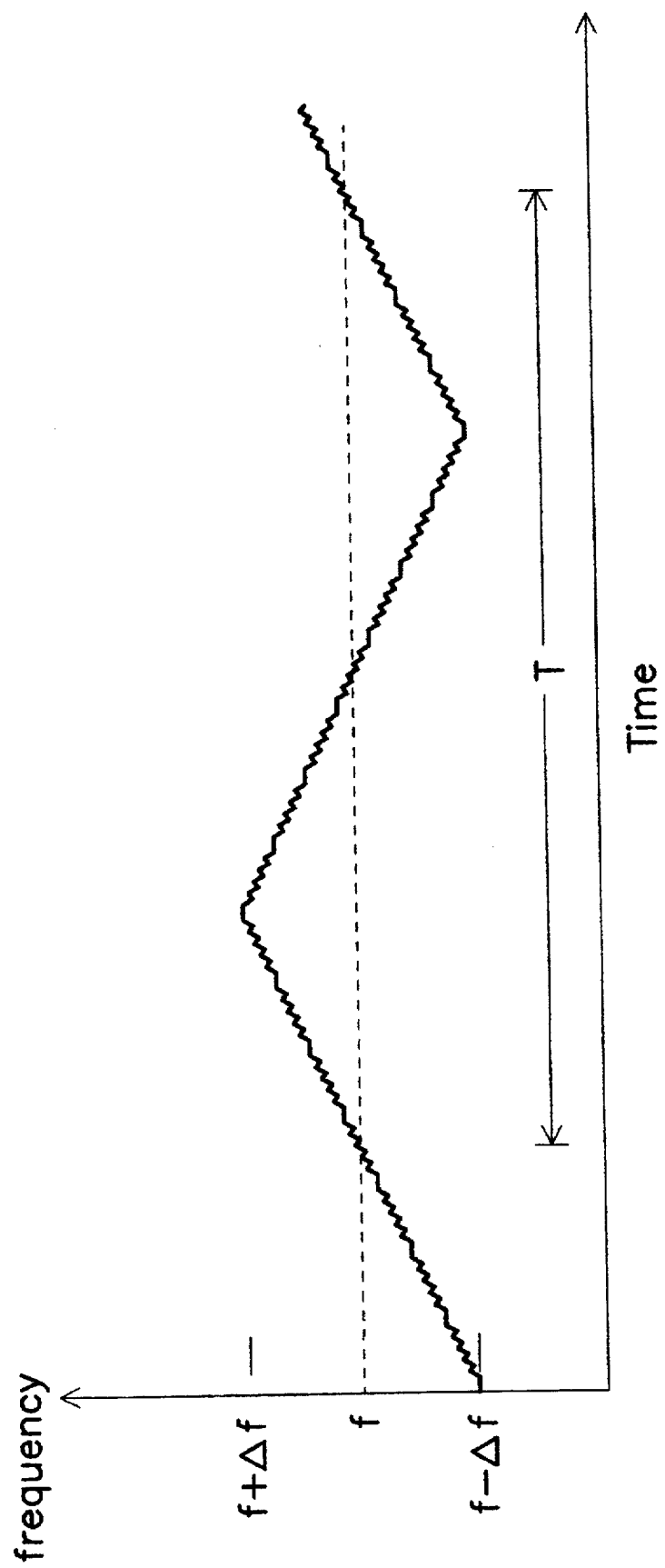
FIG. 6 shows the variation of frequency with respect to time of the clock signals produced by the clock synthesizer IC in accordance with the present invention.

For example, while $D_7D_6D_5D_4D_3$ is 10011, as the progress of $D_2D_1D_0$: 000→001→ ... 111→110→ ..., the output frequency $f_{osc}$ (MHz) transits as follows: 47.935→48.246→ ... →50.113→49.802→ .... Actually the output frequency $f_{osc}$ does not transit from a specific frequency $f_1$ to another frequency $f_2$ abruptly, but transits from $f_1$ to $f_2$ slowly with zigzag oscillation owing to the characteristics of DPLL, which is illustrated in FIG. 6. Such characteristic of DPLL is ingeniously utilized to approximate the ideal variation of frequency with respect to time shown in FIG. 4.

In summary, the clock synthesizer IC in accordance with the present invention not only achieves the object of low EMI, but also provides at least the following advantages: 1. It requires only commonly used logic devices such as programmable logic array and up/down counter; 2. Many characteristics such as frequency variation (Δf/f) and the EMI level, can be adjusted by making simple modifications to original circuit; 3. Since the output frequencies are derived by comparing with a reference frequency, the same as conventional technology, so the merit that it will not be pulled out of lock by external control signals is still kept.

The above description of the preferred embodiments of the present invention is intended to be utilized as an illustration of the concept of the present invention. The scope of the present invention is by no means limited by these embodiments. It is clear that various variations can be made to the system within the spirit and scope of the present invention. The scope of the present invention shall be defined in the following claims.

What is claimed is:

1. A clock synthesizer for low EMI applications comprising:

a forward programmable counter for dividing the frequency of input clock signals by M;

a feedback programmable counter for dividing the frequency of input clock signals by N;

a phase-frequency detector for accepting one input signal from said forward programmable counter and another from said feedback programmable counter and outputting two signals whose levels are determined by frequency difference and phase difference of said two input signals respectively;

a loop filter accepting the output signal of said phase-frequency detector and outputting a signal with high-frequency component filtered out;

a voltage-controlled oscillator accepting the output signal of said loop filter and outputting a signal as the input signal of said feedback programmable counter and the output signal of the whole clock synthesizer whose frequency is determined by input voltage;

a programmable logic array for controlling the dividing-number M and N of said forward programmable counter and said feedback programmable counter respectively;

an up/down counter for controlling the dividing-number N of said feedback programmable counter in cooperation with said programmable logic array by way of dividing the binary representation of said dividing-number $D_nD_{(n-1)} \ldots D_1D_0$ into two groups: $D_n \ldots D_k$ and $D_{(k-1)} \ldots D_0$ and controlling them by said programmable logic array and said up/down counter respectively in which a time interval of transition of $D_nD_{(n-1)} \ldots D_1D_0$ is determined by said up/down counter.

2. A clock synthesizer for low EMI applications as claimed in claim 1, wherein said forward programmable counter includes: a first stage which divides input clock signal frequency by two, and a second stage which is a programmable counter.

* * * * *